United States Patent

Fujita

(10) Patent No.: US 6,956,880 B2
(45) Date of Patent: Oct. 18, 2005

(54) SEMICONDUCTOR LASER MODULE

(75) Inventor: Takeshi Fujita, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 364 days.

(21) Appl. No.: 10/173,733

(22) Filed: Jun. 19, 2002

(65) Prior Publication Data

US 2003/0108077 A1 Jun. 12, 2003

(30) Foreign Application Priority Data

Dec. 6, 2001 (JP) ........................................ 2001-372506

(51) Int. Cl.$^7$ ................................................ H01S 3/13
(52) U.S. Cl. ........................................ 372/43; 372/29
(58) Field of Search .............................. 372/43, 29, 38

(56) References Cited

U.S. PATENT DOCUMENTS

| | | | | |
|---|---|---|---|---|
| 4,819,241 | A | * | 4/1989 | Nagano .................. 372/38.03 |
| 5,745,625 | A | * | 4/1998 | Aikiyo et al. ................. 385/94 |
| 6,101,200 | A | * | 8/2000 | Burbidge et al. ...... 372/29.021 |
| 6,665,323 | B2 | | 12/2003 | Fujita |
| 6,733,190 | B2 | * | 5/2004 | Kuhara et al. ................ 385/94 |
| 6,751,380 | B1 | * | 6/2004 | Imamura et al. .............. 385/37 |

FOREIGN PATENT DOCUMENTS

| | | |
|---|---|---|
| JP | 03-106134 | 5/1991 |
| JP | 09-191125 | 7/1997 |
| JP | 2000-114648 | 4/2000 |

OTHER PUBLICATIONS

U.S. Appl. No. 09/904,504, filed Jul. 16, 2001, Title "Semiconductor Laser Module Constituted by Optically Coupling Optical Fiber Having Fiber Grating and Laser Diode", Inventor, Takeshi Fujita.

U.S. Appl. No. 09/904,509, filed Jul. 16, 2001, "Semiconductor Laser Module Constituted by Optically Coupling Optical Fiber Having Fiber Grating and Laser Diode", Takeshi Fujita.

* cited by examiner

Primary Examiner—James Vannucci
(74) Attorney, Agent, or Firm—Burns, Doane, Swecker & Mathis LLP

(57) ABSTRACT

A semiconductor laser module comprises a laser diode that emits light in a frontward direction and a rearward direction, an optical fiber that transmits the light emitted in the frontward direction by the laser diode, and a monitor photodiode that receives the light emitted in the rearward direction by the laser diode. The monitor photodiode is characterized in that its sensitivity characteristic has a negative temperature coefficient.

5 Claims, 5 Drawing Sheets

SEMICONDUCTOR LASER MODULE

FIELD OF THE INVENTION

The invention relates to a semiconductor laser module comprising an optical fiber and a laser diode which are optically coupled to each other, and a monitor photodiode which receives light emitted from the rear side of the laser diode.

BACKGROUND OF THE INVENTION

FIG. 8 is a block diagram showing the construction of a conventional semiconductor laser module. The conventional semiconductor laser module includes a laser diode (LD) 1, an optical fiber 2 for transmitting the light emitted from the front side of the laser diode 1, and a lens 3 disposed between the LD 1 and the optical fiber 2 for converging the light emitted from the front side of the laser diode 1. Also, a monitor photodiode (PD) 4 is disposed on the rear side of the LD 1 to monitor the light emitted from the rear side of the LD 1, and an APC (automatic power control) circuit 5 is used for controlling the driving current of the LD so as to make a monitor PD current constant to keep output of the optical fiber constant.

Conventionally, in semiconductor laser modules for dealing with a short wavelength band around 980 nm, Si—PD having a high sensitivity concerned above wavelength band have been used as a monitor PD.

FIG. 9 shows a relationship between LD operating current and fiber end optical output of a semiconductor laser module of 980 nm band using Si—PD. In FIG. 9, optical output from the front side due to temperature of the LD is changed to 72.9 mW at 5° C. and 66.1 mW at 45° C. when an operating current is 150 mA, that is, a reduction of 0.43 dB occurs (=10×LOG (66.1/72.9)).

FIG. 10 shows measurement results of sensitivity characteristic of Si—PD relative to temperature. Data in FIG. 10 indicates an increase of 0.25 to 0.3 dB between 5° C. and 45° C. That is, the sensitivity characteristic of Si—PD presents a positive temperature coefficient, at which the sensitivity is enhanced as temperature rises.

FIG. 11 shows a relationship between monitor PD current and fiber end optical output of a semiconductor laser module of 980 nm band using an Si—PD. When a monitor operating current of Si—PD is 0.116 mA, the optical output is 72.9 mW at 5° C. and 62.8 mW at 45° C., that is, a reduction of 0.65 dB (=10×LOG (62.8/72.9)) occurs. This indicates a tracking error of a semiconductor laser module, and means a decline above temperature change of the LD as apparent from comparison with FIG. 9.

Reasons for the tracking error in a semiconductor laser module include a change in reflection coefficients of an LD on front and rear sides due to temperature, deviation of optical axis of the optical fiber. Usually, the reflection coefficient of the LD is as low as several percents on the front side but is as high as 90% or higher on the rear side, whereby change is large due to temperature in optical output from the front side of an LD but is little on the rear side of an LD. Therefore, in a case of performing an APC control with a constant monitor PD current, a large amount of tracking error occurs due to temperature change. That is, a decline in optical output from the front side in FIG. 9 substantially corresponds to that. However, in the case of using Si—PD, the PD sensitivity is enhanced by temperature rise as shown in FIG. 10, so that even upon reception of the same optical output the monitor PD current becomes large with temperature rise. This current is fed back to an APC circuit in which the monitor PD current is controlled to be made constant, whereby the APC circuit operates in a direction of decreasing an LD operating current (direction of decreasing an optical output) to thereby make a tracking error further larger.

As described above, conventional semiconductor laser modules of 980 nm band use an Si—PD for APC circuits, and so a tracking error due to temperature change becomes larger than that due to an LD itself.

SUMMARY OF THE INVENTION

It is an object of this invention to provide a semiconductor laser module capable of reducing a tracking error due to temperature change more as compared to that due to an LD itself.

The semiconductor laser module according to the invention comprises a laser diode which emits light in a frontward direction and a rearward direction, an optical fiber which transmits the light emitted in the frontward direction by the laser diode, and a monitor photodiode which receives the light emitted in the rearward direction by the laser diode. The sensitivity characteristic of the monitor photodiode has a negative temperature coefficient.

Other objects and features of this invention will become apparent from the following description with reference to the accompanying drawings.

DETAILED DESCRIPTION

Figure 1:
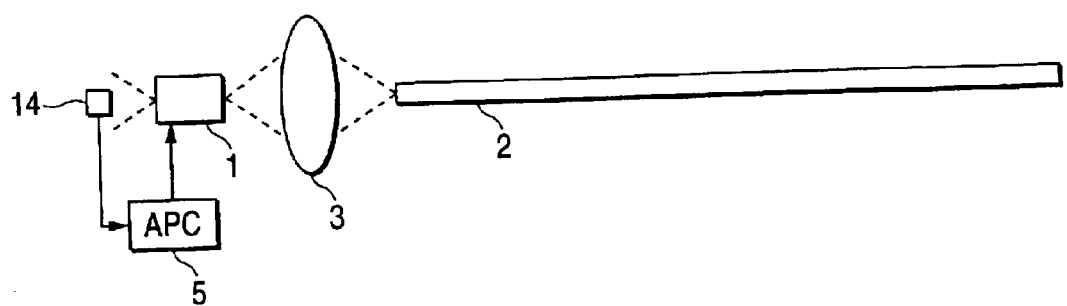
FIG. 1 is a block diagram showing the construction of a semiconductor laser module according to an embodiment of the invention.

FIG. 1 shows a block diagram of a semiconductor laser module according to an embodiment of the invention. The semiconductor laser module according to the embodiment of the invention is provided with an LD 1 and an optical fiber 2. A monitor PD 14 using InGaAs—PD is disposed on the rear side of the LD 1 to monitor light emitted from the rear side of the LD 1. An APC circuit 5 is used for controlling driving current of the LD so as to make a monitor PD current constant to keep output of the optical fiber constant.

Figure 2:
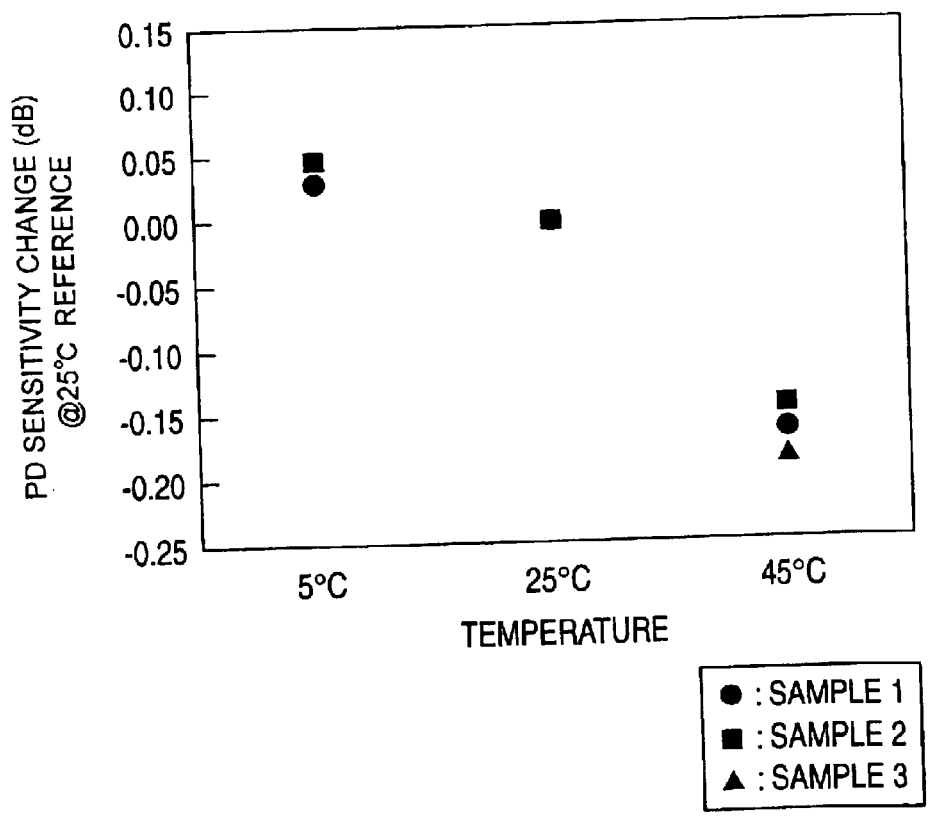
FIG. 2 is a diagram showing measurement results of sensitivity characteristic of InGaAs—PD relative to temperature.

FIG. 2 shows measurement results of sensitivity characteristic of InGaAs—PD relative to temperature. InGaAs—PD has a negative temperature coefficient to be decreased in sensitivity as temperature rises, and data in FIG. 2 indicates a decline of 0.2 to 0.25 dB between 5° C. and 45° C.

Figure 3:
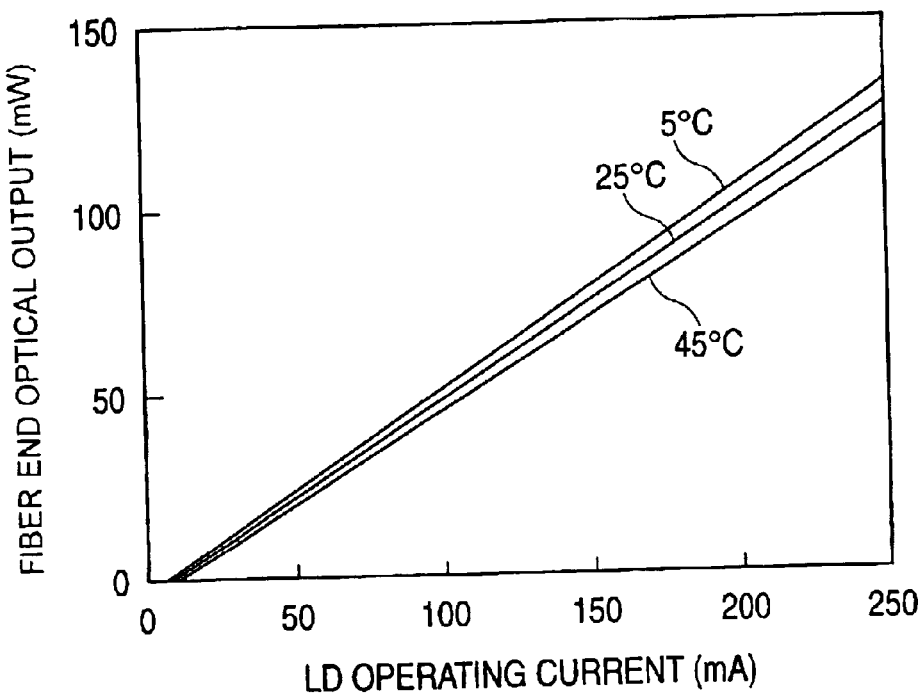
FIG. 3 is a diagram showing a relationship between LD operating current and fiber end optical output of an LD module of 980 nm band using InGaAs—PD.
Figure 4:
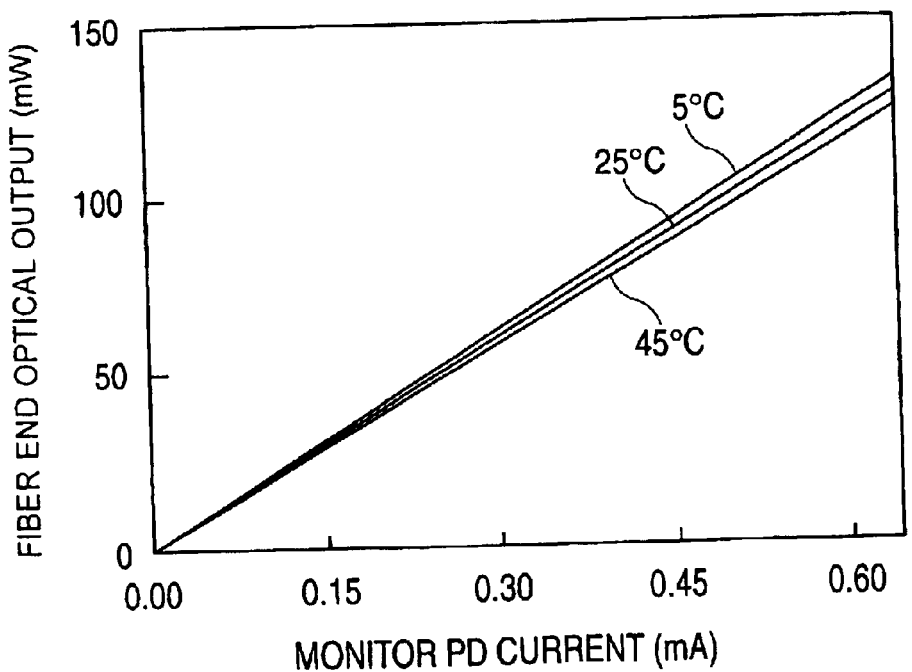
FIG. 4 is a diagram showing a relationship between monitor PD current and fiber end optical output of an LD module of 980 nm band using InGaAs—PD.

FIG. 3 shows a relationship between LD operating current and fiber end optical output of the semiconductor laser module of 980 nm band using InGaAs—PD. FIG. 4 shows a relationship between monitor PD current and fiber end optical output of the semiconductor laser module of 980 nm band using InGaAs—PD.

In FIG. 3, optical output from the front side due to temperature of the LD is changed to 78.3 mW at 5° C. and 71.2 mW at 45° C. when an operating current is 150 mA, that is, a reduction of 0.41 dB (=10×LOG (71.2/78.3)) occurs. Since the InGaAs—PD receiving the light emitted rearward of the LD has a temperature coefficient whose sensitivity characteristic is negative, the monitor current is decreased corresponding to decline in sensitivity for the light emitted from the rear side of the LD which is little varied due to temperature rise. The APC circuit will control an operating current of the LD in a direction of increasing the current with respect to the decreased monitor current.

In FIG. 4, when a monitor current of the InGaAs—PD is 0.395 mA, the optical output is 78.3 mW at 5° C. and 74.8 mW at 45° C. to decrease as low as 0.2 dB (=10×LOG (74.8/78.3)). This indicates a tracking error of the module, and the tracking error is reduced as compared with the decline due to temperature change of the LD.

Figure 5:
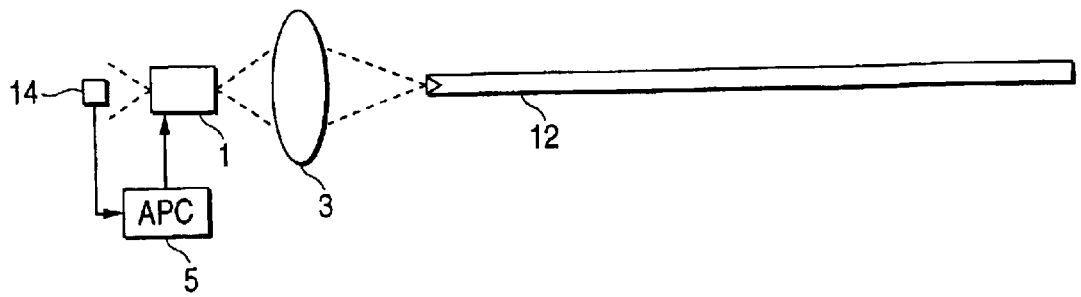
FIG. 5 is a block diagram showing the construction of a semiconductor laser module using a core-expanded fiber according to the embodiment.

The semiconductor laser module according to the invention may be one using a core-expanded fiber 12 shown in FIG. 5. The use of the core-expanded fiber can mitigate tolerance due to deviation of optical axis and is advantageous in occurrence of deviation of optical axis due to temperature change, further enabling enhancement in manufacture yield.

Figure 6:
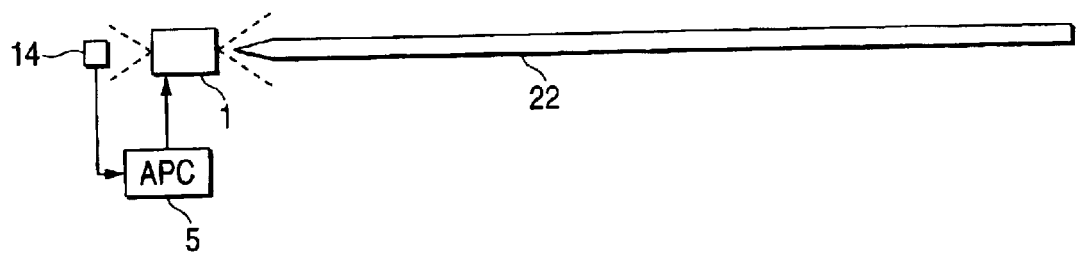
FIG. 6 is a block diagram showing the construction of a semiconductor laser module using a wedge-shaped fiber according to the embodiment.

A wedge-shaped fiber 22 with a tip end formed in wedge-shaped form shown in FIG. 6 may be used. This can enhance coupling efficiency in the case of LD emitting elliptical-shaped light, and omit the lens 3, by which low cost can be expected due to reduction in the number of parts.

Figure 7:
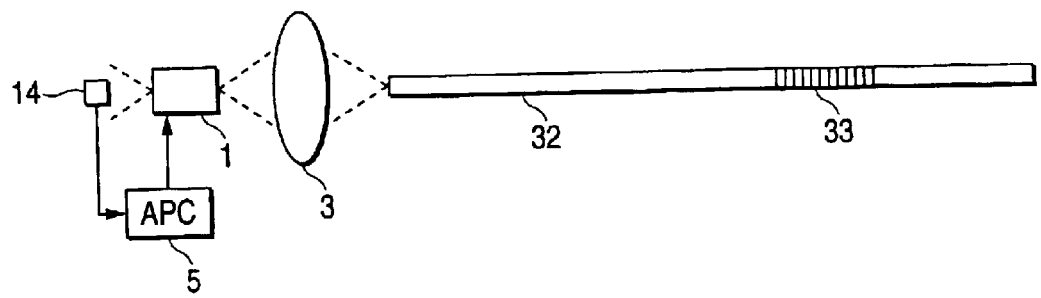
FIG. 7 is a block diagram showing the construction of a semiconductor laser module using an optical fiber to which a fiber grating according to an embodiment of the invention is applied.
Figure 8:
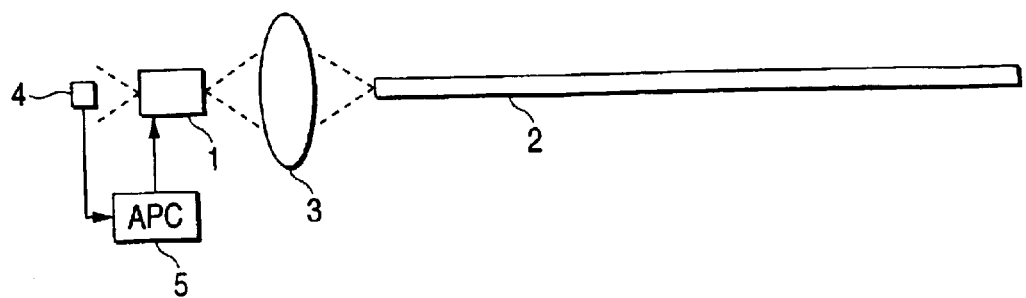
FIG. 8 is a block diagram showing the construction of the conventional semiconductor laser module.
Figure 9:
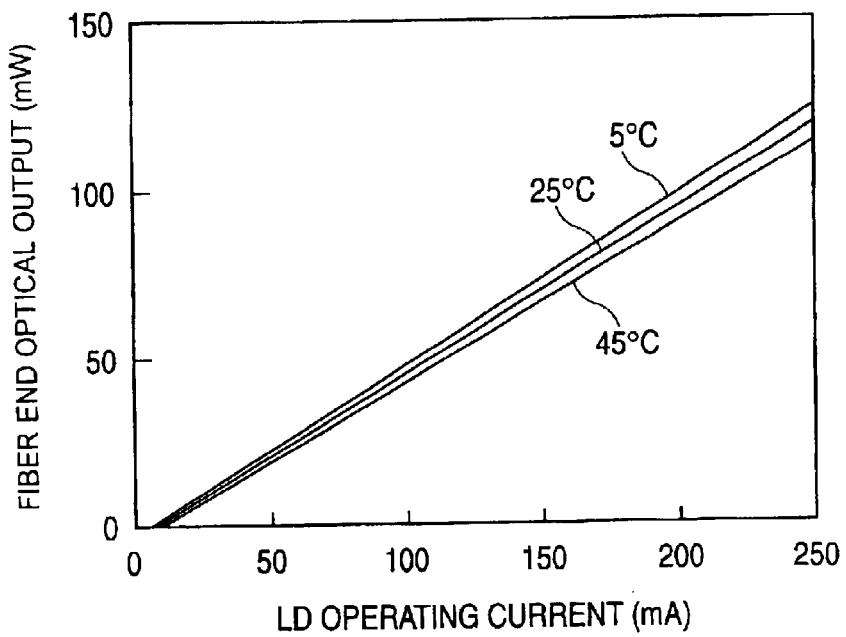
FIG. 9 is a diagram showing a relationship between LD operating current and fiber end optical output of the semiconductor laser module of 980 nm band using Si—PD.
Figure 10:
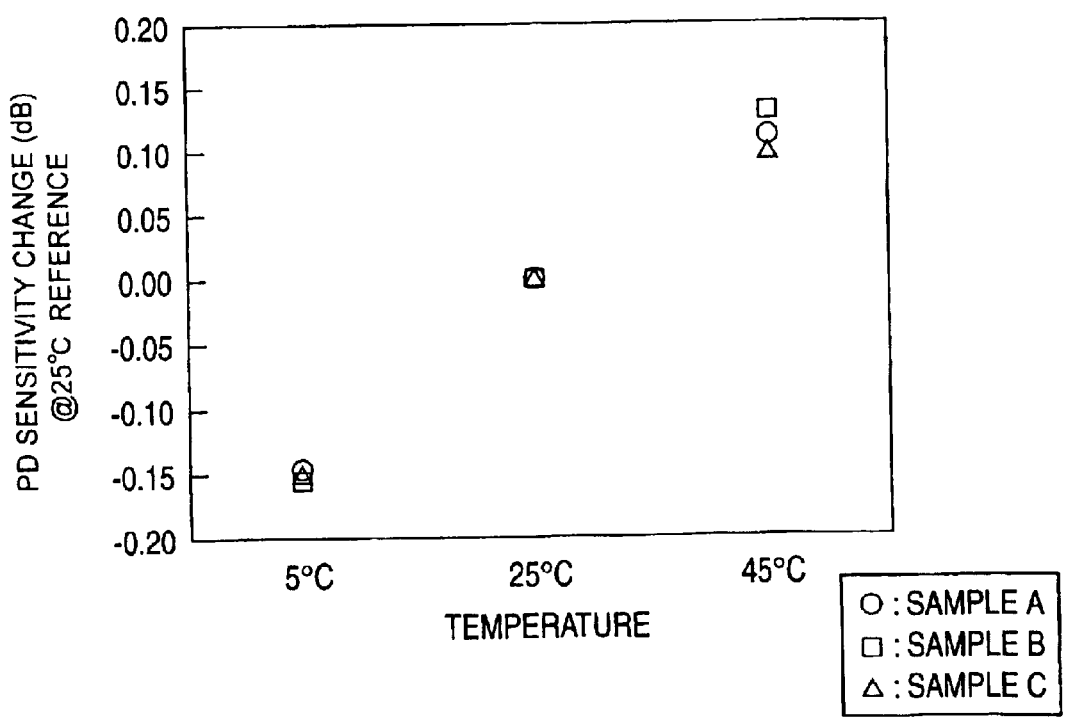
FIG. 10 is a diagram showing measurement results of sensitivity characteristic of Si—PD relative to temperature.
Figure 11:
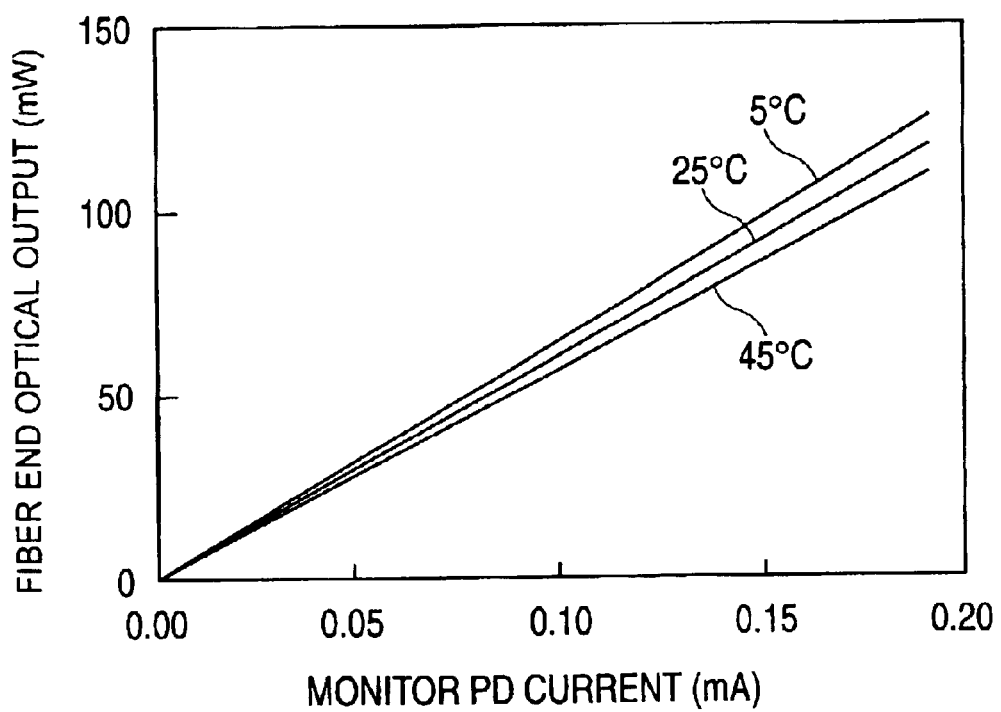
FIG. 11 is a diagram showing a relationship between monitor PD current and fiber end optical output of the semiconductor laser module of 980 nm band using Si—PD.

An optical fiber 32 to which a fiber grating 33 as shown in FIG. 7 is applied, may be used. Thereby, it is possible to realize a semiconductor laser module in which oscillation spectrum of LD can be controlled to stably provide a desired wavelength.

As described above, with the semiconductor laser module according to the invention, the InGaAs—PD having a temperature coefficient whose sensitivity characteristic is negative, is used for a monitor PD receiving the light emitted from the rear side of the LD, and therefore a tracking error can be reduced more relative to decline of the LD itself due to temperature change.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor laser module comprising:

a laser diode which emits light in a frontward direction and a rearward direction;

an optical fiber which transmits the light emitted in the frontward direction by the laser diode; and a monitor photodiode which receives the light emitted in the rearward direction by the laser diode, wherein the sensitivity characteristic of the monitor photodiode has a negative temperature coefficient.

2. The semiconductor laser module according to claim 1, wherein the monitor photodiode is InGaAs-PD.

3. The semiconductor laser module according to claim 1, wherein the optical fiber is a core-expanded fiber.

4. The semiconductor laser module according to claim 1, wherein the optical fiber is a wedge-shaped fiber.

5. The semiconductor laser module according to claim 1, wherein the optical fiber has a fiber grating formed in the optical fiber to reflect light in a specific wavelength to a side of the laser diode.

* * * * *